(12) United States Patent
Cho et al.

(10) Patent No.: US 10,141,933 B2
(45) Date of Patent: Nov. 27, 2018

(54) SELF-REPAIRING DIGITAL DEVICE WITH REAL-TIME CIRCUIT SWITCHING INSPIRED BY ATTRACTOR-CONVERSION CHARACTERISTICS OF A CANCER CELL

(71) Applicant: KOREA ADVANCED INSTITUTE OF SCIENCE AND TECHNOLOGY, Daejeon (KR)

(72) Inventors: Kwang-Hyun Cho, Daejeon (KR); Isaak Yang, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 15/788,935

(22) Filed: Oct. 20, 2017

(65) Prior Publication Data

US 2018/0302092 A1 Oct. 18, 2018

(30) Foreign Application Priority Data

Apr. 12, 2017 (KR) ........................ 10-2017-0047596

(51) Int. Cl.
*H03K 19/003* (2006.01)
*H03K 19/00* (2006.01)

(52) U.S. Cl.
CPC ..... *H03K 19/0033* (2013.01); *H03K 19/0002* (2013.01)

(58) Field of Classification Search
CPC ............. H03K 19/003; H03K 19/0033; H03K 19/00338; H03K 17/08
See application file for complete search history.

(56) References Cited

U.S. PATENT DOCUMENTS

| 9,692,417 | B1* | 6/2017 | Rezayee | H03K 19/003 |
| 9,780,787 | B2* | 10/2017 | Cho | H03K 19/003 |
| 2006/0267653 | A1* | 11/2006 | Fulkerson | H03K 3/0375 |
| | | | | 327/208 |

(Continued)

OTHER PUBLICATIONS

Avirneni,"Low Overhead Soft Error Mitigation Techniques for High-Performance and Aggressive Designs" IEEE Transactions on Computers, vol. 61, No. 4, Apr. 2012, pp. 488-501.

(Continued)

*Primary Examiner* — Jason M Crawford
(74) *Attorney, Agent, or Firm* — Mayer & Williams, PC; Stuart H. Mayer

(57) ABSTRACT

An electric device, which includes a first switch-unit providing a first internal circuit signal, a first delay circuit unit outputting a second internal circuit signal which is generated by delaying the first internal circuit signal, a first AND logic outputting a first repair-signal generated by a logical AND operation between the first internal circuit signal and the second internal circuit signal, a first OR logic outputting a second repair-signal generated by a logical OR operation between the first internal circuit signal and the second internal circuit signal, and a second switch-unit selecting one of the first repair-signal and the second repair-signal according to a third internal circuit signal generated by an operation including a logical AND operation between the first repair-signal and the second repair-signal and providing the selected one as an output signal through an output terminal, is released.

11 Claims, 11 Drawing Sheets

(56) References Cited

U.S. PATENT DOCUMENTS

2014/0247068 A1\* 9/2014 Smith ................ H03K 19/0033
  326/12

OTHER PUBLICATIONS

Galin et al. "Upset Hardened Memory Design for Submicron CMOS Technology" IEEE Transactions on Nuclear Science, vol. 43, No. 6, Dec. 1996, pp. 2874-2878.

\* cited by examiner

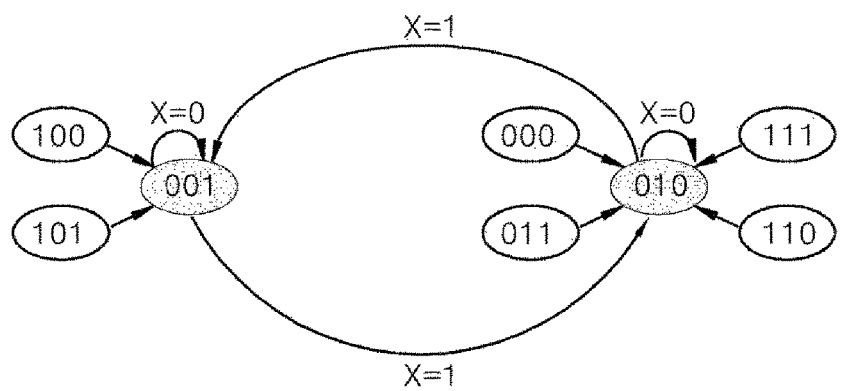
FIG 2 (a)
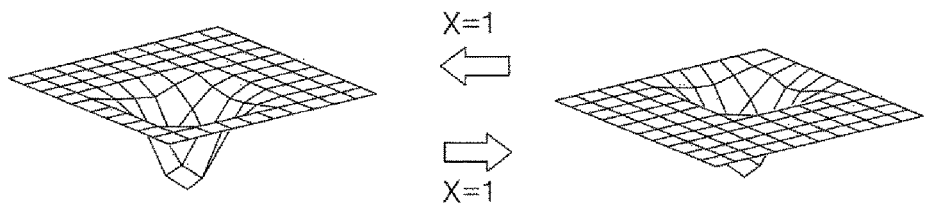
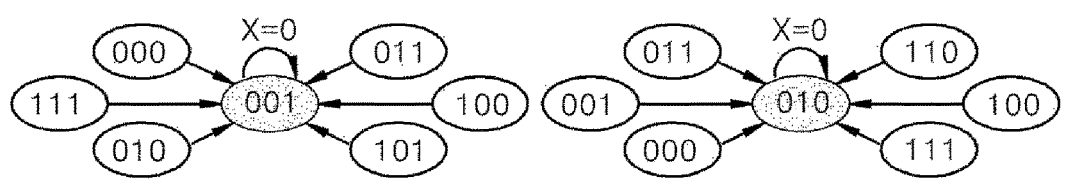
FIG. 2(b)

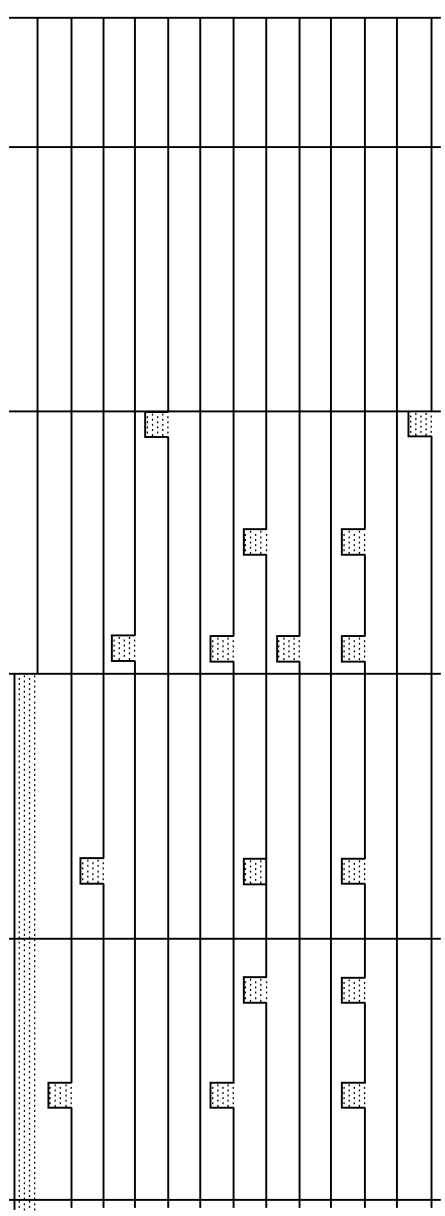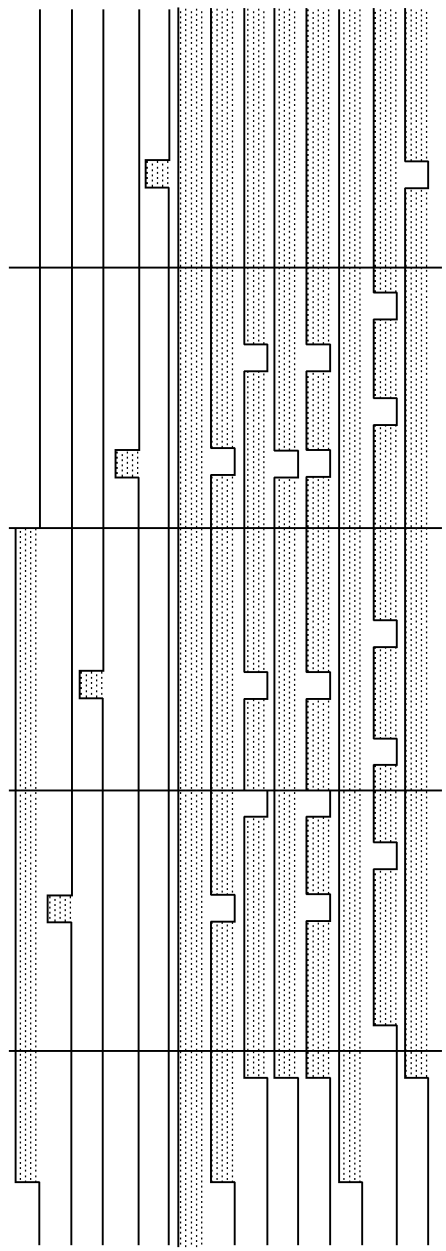

COMPARISON OF ERROR-TOLERANCE AND HARDWARE OVERHEAD

| Method | Transistors required for data storage (Ns) | Transistors required for error-restoration (Nr) | Transistors overhead (Nr/Ns) | Power overhead | Self-repairing of both restoration hardware and data storage hardware | Condition for error restoration |
|---|---|---|---|---|---|---|
| Proposed RTLS-based self-repairing system | 24 | 32 | 133% | 36% | Yes | Except the moment for valid data transition |
| TMR | N (Data storage hardware) | 2N+voter (Twice data storage hardware+voter) | 200% +(voter/N) | 200% | No | Except the moment for valid data transition |
| ABC | 21 | 45 | 214% | 53% | No | Except the moment for valid data transition |
| RAZORII | 14 | 31 | 221% | 28.5% | No | Half of clock period |
| SETOFF | 18 | 30 | 166% | 28% | No | Error detection only |
| BISER | 16 | 14 (30 with scan FF) | 87% (187% with scan FF) | 126% | No | The error on the input of C-element (only scan flip-flops are on a chip) |

FIG. 8

SELF-REPAIRING DIGITAL DEVICE WITH REAL-TIME CIRCUIT SWITCHING INSPIRED BY ATTRACTOR-CONVERSION CHARACTERISTICS OF A CANCER CELL

CROSS-REFERENCE TO RELATED APPLICATION

This application claims priority to Korean Patent Application No. 10-2017-0047596 filed on Apr. 12, 2017, and all the benefits accruing therefrom under 35 U.S.C. §119, the contents of which are incorporated by reference in their entirety.

ACKNOWLEDGEMENT

This work was supported by the National Research Foundation of Korea (NRF) grants funded by the Korea Government, the Ministry of Science and ICT (2017R1A2A1A17069642 and 2015M3A9A7067220).

BACKGROUND

The present-invention relates to an electric device and especially to a technique of repairing an error occurred in the electric device so that not only an output value of the electric device but also a circuit internal state value may not be changed and maintained with a wrong state.

The main factor of an occurrence of a soft error of an IC Integrated Circuit) is a particle radiation. The main source of this particle radiation is the radioactive decay from packaging material. Packaging material releases radioactive contaminants. Alpha radiators from these materials may pass through a semiconductor. A cosmic ray is another main source of the particle radiation. Although the cosmic ray doesn't nearly reach ground level, the cosmic ray may make powerful particle radiations like protons and Pions with considerable amount. Therefore, the level of the soft error induced by the particle radiation on the ground level may not be ignored. Energy transfer induced by ionization of two types of particle radiations in a semiconductor material generates electron-hole pairs, and an electric field in a transistor cause accumulation of electric charges in a circuit node. If the accumulated electric charges last during sufficient time, these may generates a transient voltage pulse flipping the digital value of the circuit node. The change induced from the soft error is generally called a SEU (Single-Event-Upset).

The SEU may occur in memory elements, sequential elements, and combinational elements, where the sequential elements among these are the most vulnerable to the SEU. Because of cross-coupled structure of a flip-flop and latch, an 1-bit flip by SET(Single-Event-Transient) on one node of a sequential element may induce a bit flip wrong value in other nodes, and then the wrong values in the other nodes may maintain the wrong value at the node where the SET was generated at first. In this manner, the fliped bit values in sequential element last, as a SEU until a new value is inputted to the element. Also, in the sequential elements, error rate of these radiation-induced errors may exceed the error rate in unprotected SRAM. Thus, a technique making the sequential element strong against the SEU is required.

RAZOR II which is a technique for handling a SEU in sequential elements has been developed. This technique includes a transition director circuit preventing a valid transition which may be detected as one error when a value is changed during a clock-to-Q delay of a latch. As a result, the circuit called as a transition director may detect only an invalid transition, and may not store the error.

SETTOFF which is another developed technique for handling a SEU in sequential elements has been developed. This technique may detect one error transmitted from input. Also, this technique may include a detection clock and transition detection circuit. And this technique may modify an output of a flip-flop by using an XOR logic. But this technique can modify an error only during a half of each clock period.

In addition to that, BISER which is another technique for handling a SEU in the sequential elements has been developed.

The prior arts handling the above-mentioned SEU of a sequential element may correct an error only for limited cases. Also, in the existing system, the reliability is limited because the sequential element hardware and the error-repairing hardware are implemented separately. Existing systems cannot repair an error occurred in the repairing hardware, because the repairing hardware are developed independently from the sequential element and only to access the error-repairing in the sequential element. Therefore, when an error occurs in the repairing hardware, the error processing system cannot properly repair the error occurred in the sequential element. Also, an potential error rate in the repairing hardware cannot be ignored because the repairing hardware requires many additional transistors.

SUMMARY

To resolve the above-mentioned problem, the present invention provides a new technique which can repair both the errors occurred in a data-storage hardware and an error-repairing hardware in a single IC.

A self-repairing system including RTLS (Real-Time Logic Switching) provided according to an aspect of the prevent invention is inspired by a cellular system. Especially, a special attention was paid to a strong characteristic of a gene regulation network in a cancer-cell.

A self-repairing system according to an aspect of the prevent invention includes a new circuit architecture including RTLS having a data storage function and an error repairing function in a single IC, by focusing on how cancer-cells show robustness against a structural change. The resulting RTLS-based self-repairing system has a similar hardware overhead compared to a system according to the prior art, but guarantees greater reliability. And the resulting self-repairing system can correct an error occurred in any place in the whole circuit including a repairing hardware for any steady state of the circuit.

A RTLS-based self-repairing circuit according to an aspect of the prevent invention has been developed on the basis of a basic robust characteristic of a cancer-cell. A cancer-cell usually maintains its proliferation state as an malignant characteristic. To maintain the proliferation state of the cancer-cell, the cancer-cell has extra states (it is known as a basin of an attractor in a cellular system of biology) which are eventually transited to its original proliferation state ('attractor'). Thus, when an environmental perturbation changes the state of a cancer-cell, and if the perturbed state is included in the extra states, the extra states are repaired to the original proliferation state. By implementing these robust characteristic into an electric circuit, a new circuit architecture repairing any SEU errors can be developed.

If a wrong state is included in the extra states, the system provided according to an aspect of the present invention can repair the wrong state caused by a SEU to a normal correct state. Also, a RTLS-based self-repairing system is designed to employ attractor-conversion characteristics of a cancer-cell. To treat the cancer-cell, a drug treatment maintaining the proliferation state as a steady state is administered to the cancer-cell, thus hereditary interaction in the cancer-cell is changed meaningfully. But because of the drug resistance of a cancer-cell, an attractor state is only just changed from one proliferation state to another proliferation state. In this case, despite of the drug treatment of the cancer-cell, the state of the cancer-cell is still just transited to another proliferation state. By applying this attractor-conversion characteristic to a circuit provided according to an aspect of the prevent invention, a new RTLS-based circuit structure can be developed. By introducing a new logic switching method and a data storing structure within the system provided according to an aspect of the prevent invention, the error-repairing hardware and the sequential element provided according to an aspect of the prevent invention is not implemented as separate parts which are distinguished from each other like prior arts, but is developed as one integrated system. While the system according to an aspect of the prevent invention is implemented compactly as one system, regardless of what present stored data is, any dada may be stored while ensuring the maximum reliability. Generally, since a general sequential circuit operates by switching between several stable states, the extra states regarding the stable states which are all probable wrong states occurred because of the SEU, may not be allocated for all stable states within one single operating system. Thus, one wrong state changed from one stable state may be transited to another stable state.

To overcome this problem, the RTLS method according to an aspect of the present invention is to switching a present operating circuit according to present stable state. At first, to handle a wrong state caused by the SEU, a self-repairing system based on RTLS have many extra states required for only present stable state. When the stable state is transited another stable state by the change of external input, the circuit structure is changed to have a number of additional extra states, and the additional extra states are required to repair the changed stable state. Lastly, by storing any stable state, a circuit provided according to an aspect of the present invention may repair the wrong states caused by a number of SEUs to stable states, regardless of present stable states, unlike a prior art.

RTLS-based self-repairing system provided according to an aspect of the prevent invention was assessed by simulation and hardware test, and its performance was compared to its prior arts. To simulate the RTLS-based self-repairing system, various errors were generated at any node over the entire circuit. The wrong states of all nodes within the circuit was repaired immediately, the wrong state wasn't exposed to an output node. Especially, an error is always repaired regardless of whether the error is located in a data-storage hardware or an error repairing hardware. Also, the hardware overhead of the RTLS-based self-repairing system was similar with its prior art, but represented higher error tolerance.

<Self-Repairing Method Based on an Attractor-Conversion of a Cancer-Cell>

Because of strong characteristics regarding a environmental perturbation of a biology system, an attractor-conversion mechanism of a cancer-cell represent particularly strong tenacity.

FIGS. 1(a) and (b) show attractor landscapes and Boolean networks. FIG. 1(a) shows a first attractor landscape of a cancer-cell, FIG. 1(b) shows an attractor landscape of the cancer-cell after a drug treatment.

A conceptual system called the attractor landscape of FIG. 1(a) is often adopted to perform analysis using a Boolean network. The Boolean network of FIG. 1(a) represents dynamic change of a gene regulation network by allocating a Boolean value to each gene which is expressed or silenced. In FIG. 1, each white node represents that a protein is expressed, each gray node represents that a protein is not expressed. The present state of whole Boolean network changes between latent states, the state is represented as one grid on the attractor landscape shown in FIG. 1(a). Within the attractor landscape of a cancer-cell shown in FIG. 1(a), the state is transited to stable state called an attractor(a the lowest grid in the attractor landscape). The attractor state represents a proliferation state which is a malignant characteristic of a cancer-cell. Other grids surrounding the stable state are called 'a basin of attractor', they are transited to attractors. Thus although environmental perturbation move the state of a cancer-cell to other state(a thin arrow line shown in FIG. 1(a)), the state is transited to an attractor along the route of arrow line of dash form shown in FIG. 1(a). Finally, the cancer-cell proliferates continuously.

A self-repairing circuit according to an aspect of the present invention is developed with inspiration of this strong characteristic of a cancer-cell. A stable state of the self-repairing circuit corresponds to an attractor, the extra states of the stable state correspond to a basin of an attractor to repair a SEU. To develop a system tolerant to an error, the system is usually designed so it includes extra states and a stable state.

FIGS. 2(a) and (b) are examples of a state transition diagram.

FIG. 2(a) shows an example of a state transition diagram having extra states in addition to a stable state.

FIG. 2(b) is an example of the system suggested in the present invention and shows the attractors and the states of basins which are changed according to the present stable state. Each gray ellipse represents a stable state i.e. an attractor, each white ellipse represents extra states i.e. the state of a basin.

If one error changes the stable state to wrong state, because the wrong state is included in the extra states, the wrong state may be repaired to the stable state. For example, the sequential circuit storing 3 bits, as one state shown in FIG. 2(a) may allocate 6 extra states to two stable states according to the choice of a designer, and as a result some wrong states may be repaired to a stable state. But because of allocation of these extra states, some wrong states which are not included among the allocated extra states may changed to another stable state. As shown in FIG. 2(a), when x is '0' and if the stable state "001" is changed to "000", they converge on the state "010".

To overcome this phenomenon, a RTLS method is introduced in a new circuit design by getting inspiration from attractor-conversion characteristics of a cancer-cell. A cancer-cell generally have a big basin converging on a proliferation state. But after a drug treatment, the dynamics of a gene regulation network is changed. So a whole attractor landscape is changed as shown in FIG. 1, another big basin which is transited another proliferation state because of drug resistance is generated. By implementing the attractor-conversion characteristic in a digital circuit, when a present stable state is transited to another stable state, RTLS-based self-repairing system changes its architecture. In this way, a circuit which has a new stable state and a new extra state after a state transition between stable states, according to an aspect of the present invention may be provided. For example, as shown in FIG. 2(b), if the stable state "001" is changed to a wrong state, the wrong state which is included 6 extra states may be transited to the stable attractor state "001". Because the value of X is changed from 0 to 1, after the stable state is changed from "001" to "010", if the stable state "010" is changed to a wrong state, the wrong state which is included 6 extra states may be transited a stable attractor "010". At this time, X='1' is a signal transiting a present stable state to another stable state and X='0' is a signal maintaining the present stable state intactly. A system according to an aspect of the present invention may allocate some extra states except the present stable state. A stable state may be allocated for an extra state after the transition of the stable state. As a result, the system according to an aspect of the present invention has greater reliability than prior error correction system.

An electric device provided according to an aspect of the present invention includes a first switch-unit 15 providing a first internal circuit signal Q1; a first delay circuit unit 16 outputting a second internal circuit signal Q2 which is generated by delaying the first internal circuit signal; a first AND logic 13 outputting a first repair-signal Ni generated by a logical AND operation between the first internal circuit signal and the second internal circuit signal; a first OR logic 14 outputting a second repair-signal N2 generated by a logical OR operation between the first internal circuit signal and the second internal circuit signal; and a second switch-unit 25 selecting one of the first repair-signal and the second repair-signal according to a third internal circuit signal N3 generated by an operation including a logical AND operation between the first repair-signal and the second repair-signal and providing the selected one as an output signal Q through an output terminal OUT. Here, the first switch-unit provides the first internal circuit signal by selecting one of the first repair-signal and the second repair-signal according to the output signal.

Here, the first switch-unit may select the first repair-signal when the output signal is '0', and the first switch-unit selects the second repair-signal when the output signal is '1'.

Here, the electric device may further include a second AND logic 23 outputting an intermediate signal generated by the logical AND operation between the first repair-signal and the second repair-signal; and a second delay circuit unit 26 outputting the third internal circuit signal generated by delaying the intermediate signal.

Here, a second delay time $D_{b2}$ of the second delay circuit unit may be a half of a first delay time $D_{b1}$ of the first delay circuit unit.

Here, the electric device may further include a first input terminal IN1 into which an external input value D is inputted; a third switch-unit 30 selecting one of the external input value and a feedback signal Q3 outputted from the first switch-unit 15; and a second input terminal IN2 into which a route control signal EN controlling an operation of the third switch-unit is inputted.

Here, the third switch-unit may include a first tri-state (three-state, 3-state) buffer 31 into which the external input value is inputted; and a second tri-state buffer 32 into which the feedback signal is inputted. And the first internal circuit signal is determined by the output of the first tri-state buffer and the output of the second tri-state buffer, and the state of the first tri-state buffer and the state of the second tri-state buffer are controlled by the route control signal, respectively.

Here, the route control signal may be generated by a logical AND operation between a clock signal CLK and a delayed clock signal delaying the clock signal.

An electric device provided according to another aspect of the present invention includes a first switch-unit 15 providing a first internal circuit signal Q1; a first state transition storage logic 130 receiving the first internal circuit signal and outputting a first repair-signal N1; and a second state transition storage logic 140 receiving the first internal circuit signal and outputting a second repair-signal N2; a second switch-unit 25 selecting one of the first repair-signal and the second repair-signal according to a third internal circuit signal N3 generated by an operation including a logical AND operation between the first repair-signal and the second repair-signal and providing the selected one as an output signal Q through an output terminal OUT. Here, the first switch-unit provides the first internal circuit signal by selecting one of the first repair-signal and the second repair-signal according to the output signal.

Here, the first state transition storage logic may include a third delay circuit unit 136 outputting a fifth internal circuit signal Q5 which is generated by delaying the first internal circuit signal; and a first AND logic 13 outputting a first repair-signal generated by a logical AND operation between the first internal circuit signal and the fifth internal circuit signal. And the second state transition storage logic may include a fourth delay circuit unit 146 outputting a fourth internal circuit signal Q4 which is generated by delaying the first internal circuit signal; and a first OR logic 14 outputting a second repair-signal generated by a logical OR operation between the first internal circuit signal and the fourth internal circuit signal.

An electric device provided according to another aspect of the present invention includes an electric circuit. The electric circuit includes a first switch-unit providing a first internal circuit signal(Q1); a first delay circuit unit outputting a second internal circuit signal(Q2) which is generated by delaying the first internal circuit signal; a first AND logic outputting a first repair-signal(N1) generated by a logical AND operation between the first internal circuit signal and the second internal circuit signal; a first OR logic outputting a second repair-signal(N2) generated by a logical OR operation between the first internal circuit signal and the second internal circuit signal; and a second switch-unit selecting a first one of the first repair-signal and the second repair-signal according to a third internal circuit signal(N3) generated by an operation including a logical AND operation between the first repair-signal and the second repair-signal and providing the selected first one as an output signal(Q) through an output terminal. Here, the first switch-unit selects a second one of the first repair-signal and the second repair-signal according to the output signal, and provides the selected second one as the first internal circuit signal.

An data storage device according to another aspect of the present invention includes a first switch-unit 15 providing a first internal circuit signal Q1; a first delay circuit unit 16 outputting a second internal circuit signal Q2 which is generated by delaying the first internal circuit signal; a first AND logic 13 outputting a first repair-signal Ni generated by a logical AND operation between the first internal circuit signal and the second internal circuit signal; a first OR logic 14 outputting a second repair-signal N2 generated by a logical OR operation between the first internal circuit signal and the second internal circuit signal; and a second switch-unit 25 selecting one of the first repair-signal and the second repair-signal according to a third internal circuit signal N3 generated by an operation including a logical AND operation between the first repair-signal and the second repair-signal and providing the selected one as an output signal Q through an output terminal OUT. Here, the first switch-unit selects one of the first repair-signal and the second repair-signal according to the output signal, and then provide the selected one as the first internal circuit signal. Here, the data stored in the data storage device is the output signal.

To resolve the above-mentioned problem, the present invention may provide a new system capable of function as a data storage and an error-repair in a single IC.

According to one aspect according to the present invention, an electric device, comprising: a first switch-unit providing a first internal circuit signal; a first delay circuit unit outputting a second internal circuit signal which is generated by delaying the first internal circuit signal; a first AND logic outputting a first repair-signal generated by a logical AND operation between the first internal circuit signal and the second internal circuit signal; a first OR logic outputting a second repair-signal generated by a logical OR operation between the first internal circuit signal and the second internal circuit signal; and a second switch-unit selecting one (=selecting a first one) of the first repair-signal and the second repair-signal according to a third internal circuit signal generated by an operation including a logical AND operation between the first repair-signal and the second repair-signal and providing the selected one (=providing the selected first one) as an output signal through an output terminal; can be provided. Here, the first switch-unit can choose one (=select a second one) of the first repair-signal and the second repair-signal according to the output signal and provides the chosen one (=the selected second one) as first internal circuit signal.

BRIEF DESCRIPTION OF THE DRAWINGS

Exemplary embodiments can be understood in more detail from the following description taken in conjunction with the accompanying drawings, in which:

FIGS. 2(a) and 2(b) are examples of a state transition diagram.

FIGS. 7(a) and 7(b) show a simulation result according to time analysis of error-repair according to an embodiment of the present invention.

FIG. 8 is a table comparing methods for other SEU hardening according to a prior technique with the RTLS-based self-repairing system according to an embodiment of the present invention.

DETAILED DESCRIPTION OF EMBODIMENTS

Embodiments of the present invention will be described with reference to the accompanying drawings. However, the present invention is not limited to the embodiments described herein, and may be implemented in various different forms. The terminology used herein is not for limiting the scope of the present invention but for assisting with an understanding of the embodiments. Furthermore, the singular forms used below include the plural forms as well, unless otherwise indicated.

<A RTLS-Based Self-Repairing System Inspired from The Attractor-Conversion Characteristic of a Cancer-Cell>

A Comparison-Embodiment of an Attractor-Based Circuit

To develop a sequential element which is hardened to a SEU, there has been an attempt to repair an error occurred in both an error-repairing hardware and a data-storage hardware which is called an ABC (Attractor-Based Circuit) system. But the system cannot repair an error occurred in some important circuits used for error-correction.

Figure 1A:
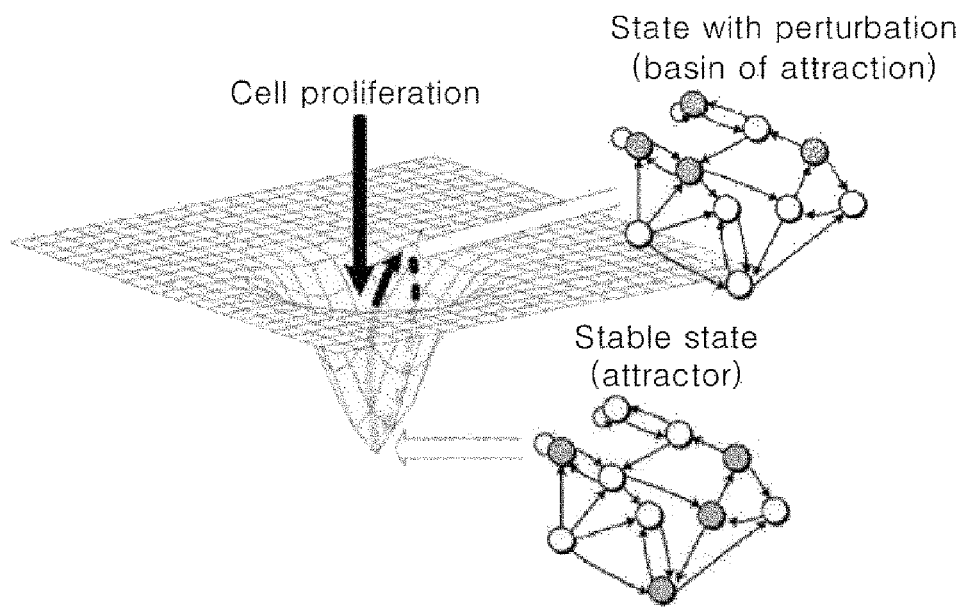
FIGS. 1(a) and 1(b) show attractor landscapes and Boolean networks.
Figure 1B:
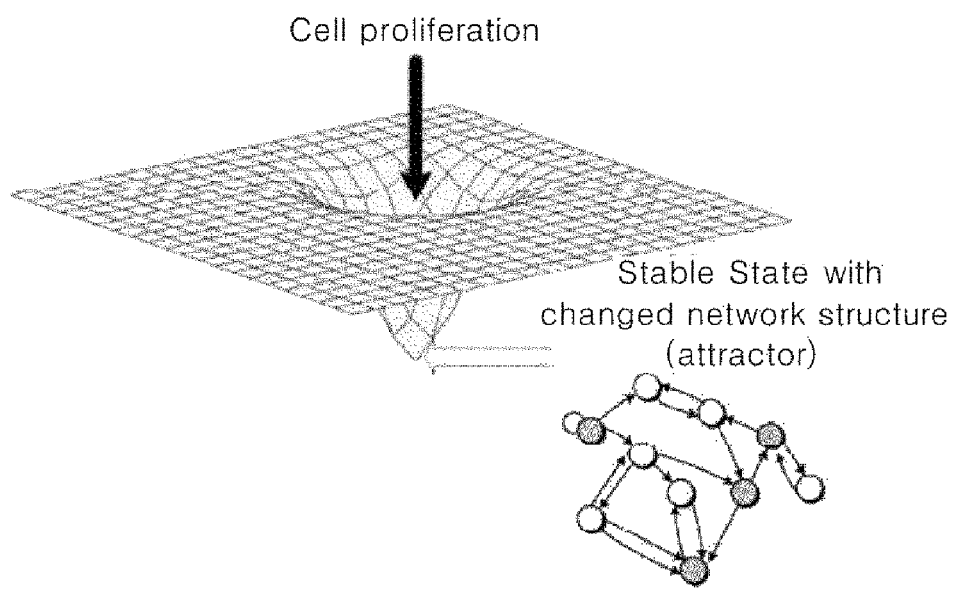
Figure 3:
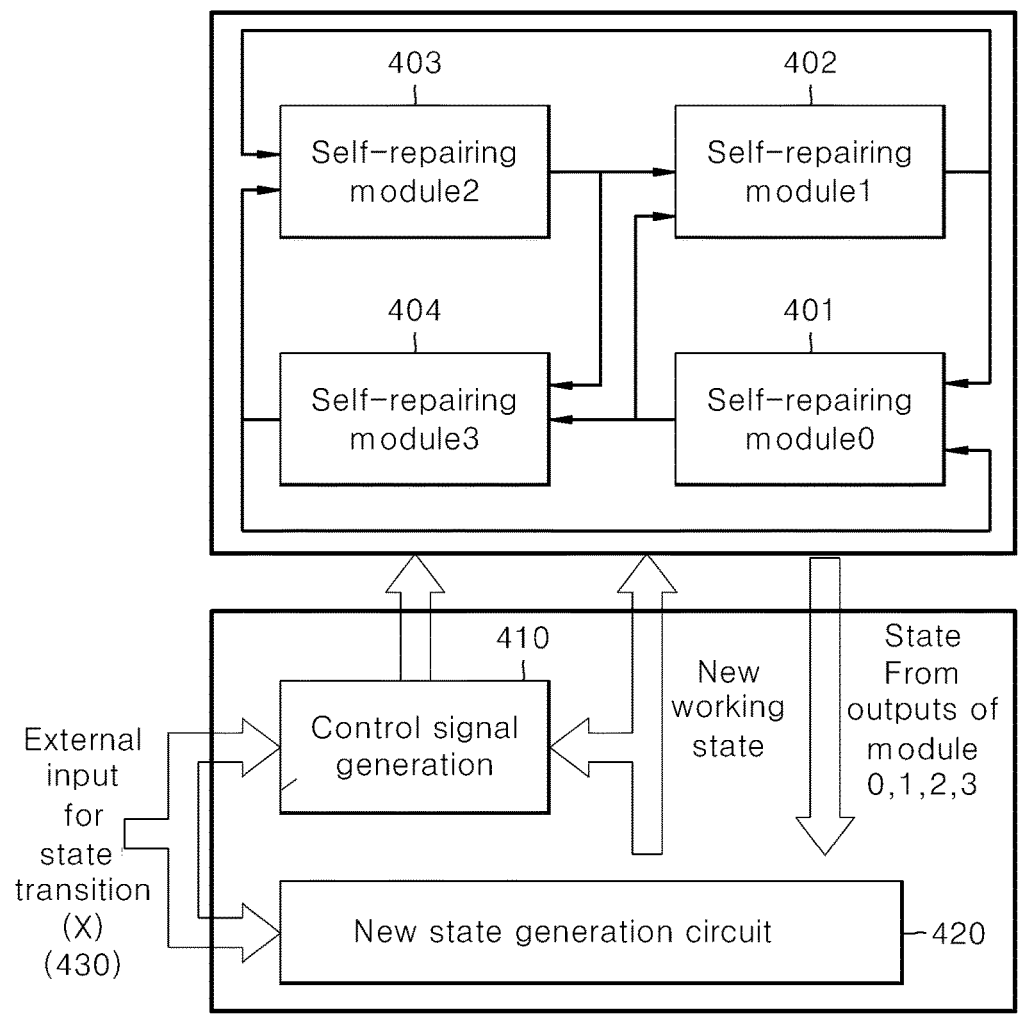
FIG. 3 shows a conceptual diagram of the ABC system.

FIG. 3 shows a conceptual diagram of the ABC system.

The ABC system shown in FIG. 3 is comprised by including self-repairing modules 401, 402, 403, 404, a control signal generation circuit 410, a new state generation circuit 420, external input for state transition 430.

By introducing feedback loops between the four modules, the error occurred in four self-repairing modules storing four digital bits may be corrected. When an error occurs in one self-repairing module, the error is detected from two different modules. After the two modules capture the error, each module isolates the error and brings an alternative value from another hardware called "New state generation circuit". In this way, the system may correct the wrong state within the four self-repairing modules. But the ABC system sill includes repairing hardware separated along with the sequential element like other existed systems. So the ABC system don't handle the error occurred in "New state generation circuit" or "Control signal generation circuit". An error within these circuits may cause abnormal operational state. When a repairing process operates properly, a repaired wrong value may be reflected in an output value. Thus, the following logic may receive the wrong value as stable input value. Furthermore, since the system requires four self-repairing modules storing four digital bits, the general demand of the system is limited.

EMBODIMENT 1

RTLS-Based Self-Repairing System According to an Embodiment of the Present Invention A RTLS-based self-repairing digital system based on a robust mechanism of a cancer-cell, according to an embodiment of the present invention, may have different circuit structure compared to the ABC system. Instead of separately implementing a hardware for data storage and a hardware for error-repair, the RTLS-based self-repairing digital system includes one united system which can store data and repair an error at the same time. As a result, the error may be repaired regardless of a position of the error in the whole circuit.

Furthermore, because the RTLS-based self-repairing digital system has a fault-masking function, the output of the system is valid, even during the time period when the values of other internal nodes of the circuit change to repair a SEU.

Finally, the RTLS-based self-repairing digital system stores one digital bit. The system may be adopted for various applications in general use by playing the same role as a flip-flop.

Figure 4:
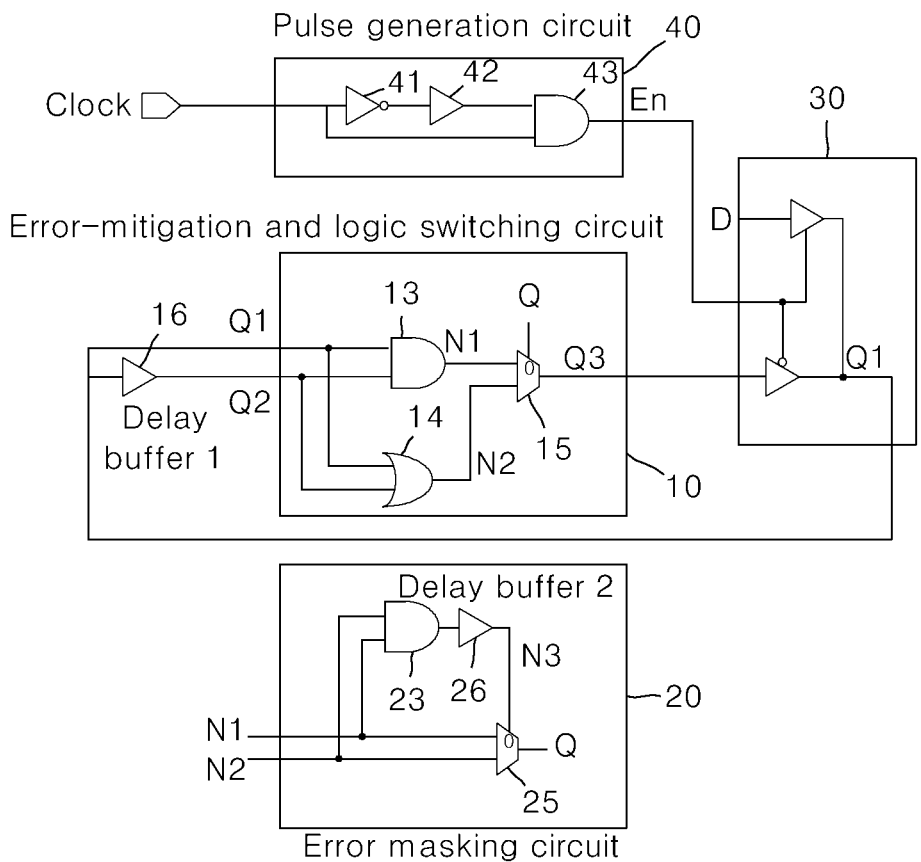
FIG. 4(a) shows a circuit structure of integrated RTLS-based self-repairing system according to an embodiment of the present invention.
FIG. 4(b) shows a circuit structure of general D-flip-flop according to an comparative embodiment.
Figure 4:
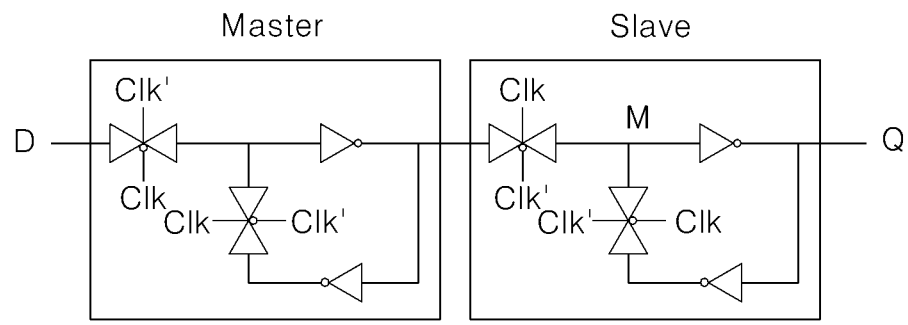

FIG. 4(a) shows a circuit structure of an integrated RTLS-based self-repairing system according to one embodiment of the present invention.

FIG. 4(b) shows a circuit structure of a general D-flip-flop according to an comparative embodiment.

As shown in FIG. 4(a), the RTLS-based self-repairing system 1 includes Pulse generation circuit for data transition, Error-mitigation and logic switching circuit 10 for switching between repairing circuits and repairing an error according to the changed steady state, and Error masking circuit 20 for the isolation of an error.

Because the RTLS-based self-repairing system 1 operates as one united system, the system 1 is separated onto the three circuits 10, 20, 30, 40 only for the convenience of explanation.

Basically, the RTLS-based self-repairing system 1 stores an 1-bit value in the output signal Q as a flip-flop.

While the 1-bit value is stored in the RTLS-based self-repairing system 1, the Error-mitigation and logic switching circuit 10 repairs any wrong bit occurred at any node to a correct bit.

Pulse generation circuit 40 of the RTLS-based self-repairing system 1 generates a high pulse having a certain period, at rising edge of the clock. When the pulse have a high value, a new value D is loaded onto the output node with the output signal Q of the RTLS-based self-repairing system 1.

When an error occurs on the output node Q, the error-mitigation and logic switching circuit 10 repairs a wrong value which may be changed from the output signal. After a new value D is loaded as the output signal Q, the error-mitigation and logic switching circuit 10 repairs the wrong value by switching between the logics based on the changed value of the output signal Q.

The value of the output signal Q may be outputted from the Error masking circuit 20.

So, an error occurred on the internal nodes with the signals Q1, Q2, Q3 of the circuit is masked and the error is not exposed to the output signal Q.

But the general flip-flop shown in FIG. 4(b) cannot repair the error, and stays in a flipped state. In the general flip-flop, if the new value inputted to the node D with change of clock is not restored to the node with the output signal Q, the error on the output signal Q cannot be repaired to a correct value. For example, while the flip-flop stores a value '0' in the node with the output signal Q, if the value at the node of the output signal Q changes from '0' to '1' due to a temporary error, the value at the node M changes from '1' to '0'. Thus, due to the logical effect from other nodes with errors to the node where the error firstly occurred, although the error occurred temporarily, the wrong value '1 ' at the node of the output signal Q cannot be changed a correct value '0'.

In contrast, in the RTLS-based self-repairing system 1 shown in FIG. 4(a), an error value is repaired immediately, because all nodes within the system are fed continuously by the correct value of an error-repairing logic.

Figure 5A:
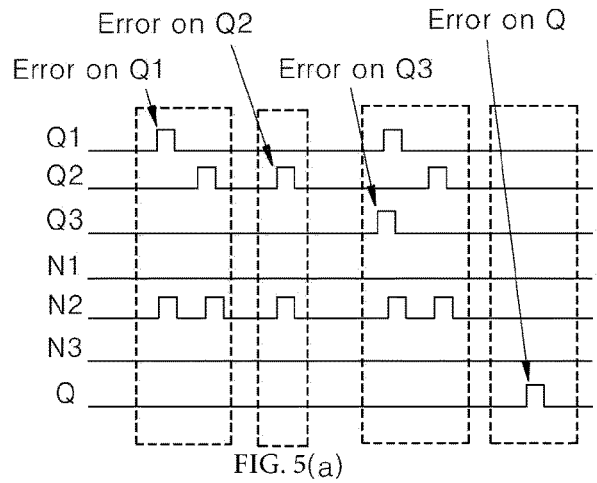
FIGS. 5(a), 5(b) and 5(c) show a repairing process of the RTLS-based self-repairing system according to an embodiment of the present invention.
Figure 5:
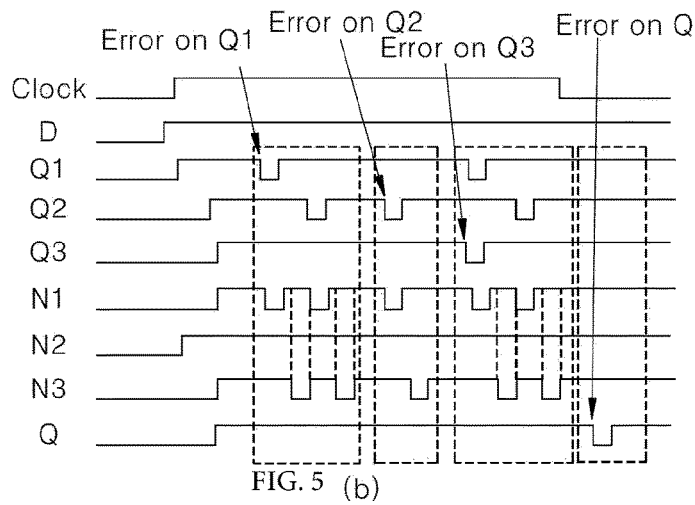

FIG. 5 shows a repairing process of the RTLS-based self-repairing system 1 according to an embodiment of the present invention.

FIG. 5(a) shows a timing diagram after various errors occur while the RTLS-based self-repairing system 1 stores the bit value '0'.

FIG. 5(b) shows a timing diagram after various errors occur while the RTLS-based self-repairing system 1 stores the bit value '1'.

Figure 5C:
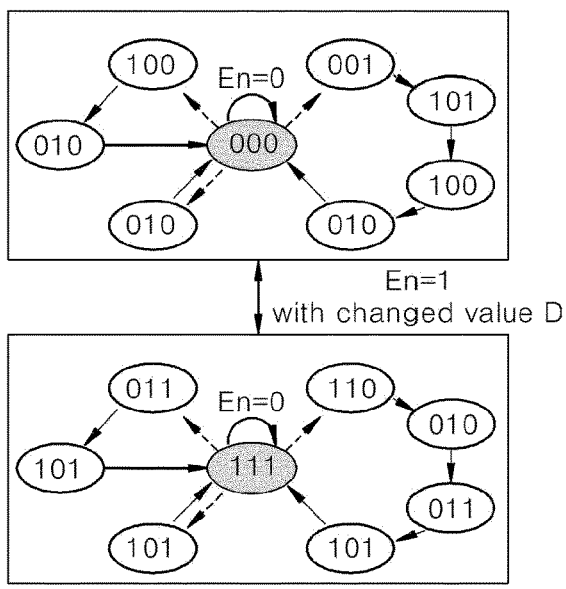

FIG. 5(c) shows an attractor-convergence characteristic of the signals Q1, Q2, Q3. Each dotted arrow represents a state transition after an error occurred, each solid line arrow represents a state transition for repairing the error, the gray ellipse represents an attractor, and each white ellipse represents the state of a basin.

Error repair in a steady state of RTLS-based self-repairing circuit The RTLS-based self-repairing system 1 shown in FIG. 4(a) repairs an error on arbitrary node when the circuit stores the bit value '0'.

As shown in FIG. 5(a), at first, all nodes with the signals Q1, Q2, Q3, N1, N2, N3 store the bit value '0'. The bit of the output signal Q and the bit of the third internal circuit signal N3 are the selection bits of the two multiplexers. Because the bit of the output signal Q and the bit at the node with the third internal circuit signal N3 are '0', respectively, the output of the AND gate 13 is selected as the output of the two multiplexers.

When an error occurs at the node with the second internal circuit signal Q2 as shown in FIG. 5(a), the wrong value '1' of the second internal circuit signal Q2 is mitigated by the AND gate 13 within the 'Error-mitigation and logic switching circuit 10'. At this moment, the multiplexer 25 within the 'Error masking circuit 20' selects N2 instead of N1, and so the wrong value on the node N2 is not transferred to the node with the output signal Q.

When an error occurs at the node with the first internal circuit signal Q1 or at the node with the feedback signal Q3, the output of the AND gate 13 within the 'Error-mitigation and logic switching circuit 10' which receives the first internal circuit signal Q1 and the second internal circuit signal Q2 as inputs is always '0', because of the delay time due to a first delay buffer 16.

Also, because of the continuous value '0' at the node with the third internal circuit signal N3, the multiplexer 25 within the 'Error masking circuit 20' selects the value '0' at the node with the first repair-signal N1 as an output value and as a result, the value at the node with the output signal Q is always '0'.

The errors of internal nodes with the signals Q1, Q2, Q3 don't cause an error to the value at the node with the output signal Q.

Thus, the value of the output signal Q which is not damaged always mitigates the wrong value on other nodes by selecting the AND gate 13 within the 'Error-mitigation and logic switching circuit 10'.

Even when an error occurs at the node with the output signal Q, the output value of AND gate 13 within the 'Error-mitigation and logic switching circuit 10' have a correct value '0'. This is because the value of node N2 is '0'.

And then, the wrong value at the node with the output signal Q is immediately repaired by the leading logics.

Error Repair After Logic Switching

The RTLS-based self-repairing system 1 according to an embodiment of the prevent invention switches the circuit structure to generate another attractor(i.e. a value '1') when the value '1' is stored instead of the value '0'. With the rising edge of the clock, the RTLS-based self-repairing system 1 receives the value '1' over the whole circuit as shown in FIG. 5(b). Because the value at the node with the output signal Q is '1', the RTLS-based self-repairing system 1 selects the output of the OR gate 14 as its output value.

When an error occurs at the node with the second internal circuit signal Q2, the wrong value is repaired by the OR gate 14 and the value at the node with the feedback signal Q3 is '1'. The wrong values of the first internal circuit signal Q1 and the second internal circuit signal Q2 are transferred to the first repair-signal N1 and the third internal circuit signal N3. While the selection bit of the third internal circuit signal N3 of the multiplexer 25 within the 'Error masking circuit 20' is '1', the value at the node with the special repair-signal N2 is '1'. Therefore, the value of the output signal Q is always '1'.

When errors occur at the node with the first internal circuit signal Q1 and the node with the feedback signal Q3, the wrong value '0' is transferred to the second internal circuit signal Q2 with a delay time. The wrong values at the nodes with the first internal circuit signal Q1 and the node with the second internal circuit signal Q2 are mitigated by the OR gate 14. The value of the output signal Q always maintains the correct value '1'. But the wrong value at the node with the first internal circuit signal Q1 and the wrong value at the node with the second internal circuit signal Q2 are transmitted to the node with the first repair-signal N1 and the node with the third internal circuit signal N3.

While the selection bit of the third internal circuit signal N3 of the multiplexer 25 within the 'Error masking circuit 20' maintains '0', the value at the node N1 is '1'. While the selection bit of the third internal circuit signal N3 of the multiplexer 25 within the 'Error masking circuit 20' maintains '1', the value at the node N2 is '1'. So the value of the output signal Q is always '1'.

An internal wrong state doesn't affect the effective value at the node with the output signal Q. Because the output signal Q maintain a correct value, the OR gate 14 can repair the error within the 'Error-mitigation and logic switching circuit 10'

The error occurred at the node with the output signal Q directly, may be immediately repaired by previous circuits, if the error is not the one transferred from other node.

Eventually, the RTLS-based self-repairing system 1 according to an embodiment of the prevent invention can repair errors occurred at internal nodes within the circuit as shown in FIG. 5(c). Also, when a correct state changes into the wrong states represented by the white ellipses shown in FIG. 5(c), the wrong state changes back to the correct state represented by the gray ellipse shown in FIG. 5(c) represents.

By implementing a logic switching techique, the RTLS-based self-repairing system 1 can repair the same wrong state occurred regardless of the present correct state. For example, the internal state "010" may be repaired to the correct state regardless of the present stable state "000" or "111". This might not be possible when the states are allocated to one static circuit.

Several Conditions for the Design of RTLS-Based Self-Repairing Circuit

Figure 6:
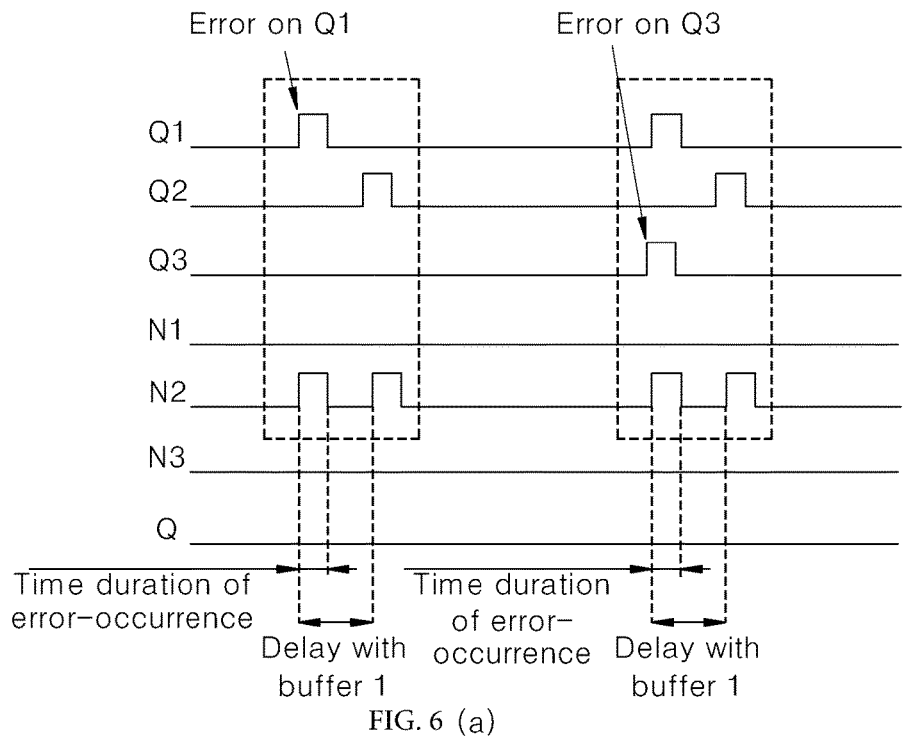
FIGS. 6(a) and 6(b) show a flow of a repairing process according to an embodiment of the present invention.
Figure 6:
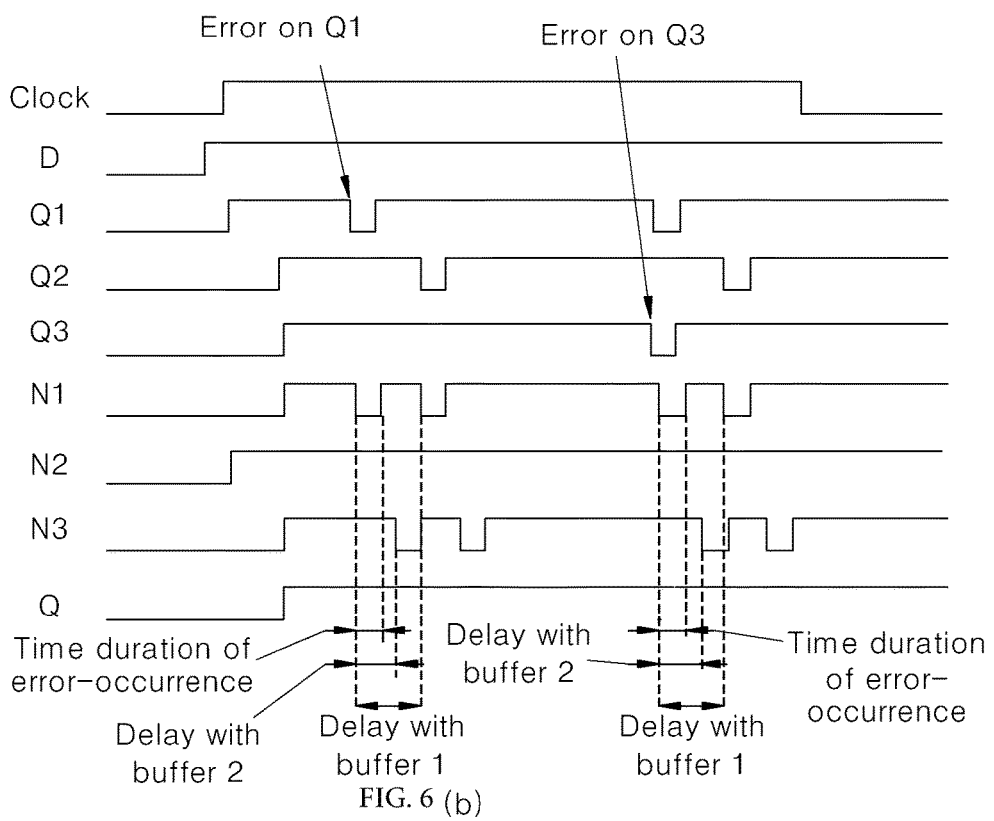

FIG. 6 shows a flow of a repairing process according to an embodiment of the present invention.

FIG. 6(a) shows a design condition while the RTLS-based self-repairing system 1 according to an embodiment of the present invention stores the value '0'.

FIG. 6(b) shows a design condition while the RTLS-based self-repairing system 1 according to an embodiment of the present invention stores the value '1'.

When the RTLS-based self-repairing system 1 according to an embodiment of the present invention stores the value '0', if the time duration during which an error exists is shorter than the buffer delay induced by a first delay buffer 16, any error at internal nodes of the circuit may be repaired. Because of the 'Error masking circuit 20', the value of the output signal Q is not damaged. When the RTLS-based self-repairing system 1 stores the value '0', the valid value of the output signal Q let the RTLS-based self-repairing system 1 always select the AND gate 13 instead of OR gate 14. Therefore, the errors on the internal value of the signal Q1, Q2, Q3 of 'Error-mitigation and logic switching circuit 10' are mitigated by the AND gate 13. Also, because the selection bit of the third internal circuit signal N3 of the multiplexers within the 'Error masking circuit 20' is always '0', the correct value at the node with the first repair-signal N1 is always transferred to the output signal Q as shown in FIG. 6(a).

To mitigate the wrong value while the RTLS-based self-repairing system 1 stores the value '1', the RTLS-based self-repairing system 1 includes another second delay buffer 26 within the 'Error masking circuit 20'. It is desired that the second time duration of a second delay caused by the second delay buffer 26 shown in FIG. 4(a) is a half of the first time duration of a first delay caused by the first delay buffer 16 shown in FIG. 4(a). Because of the second delay of the second delay buffer 26, the wrong value at the node N1 is transferred to the node with the third internal circuit signal N3 with a certain delay. Also even when the value at the node with the third internal circuit signal N3 which is the selection bit of the multiplexer 25 in the 'Error masking circuit 20' is not '1' but '0', the correct value '1' at the node with the first repair-signal N1 is selected as the value of the output signal Q. Therefore, the output signal Q always has the correct value '1'.

As a result, the main condition equation of the RTLS-based self-repairing system 1 may be given as FOMULA 1.

$$T_e < D_{b1}/2 \ (D_{b2}=D_{b1}/2 \text{ or } D_{b1}=2*D_{b2}) \quad \text{[FORMULA 1]}$$

Here, $T_e$ is the time duration during which an error exists, $D_{b1}$ is the first delay time by the first delay buffer 16 in the 'Error-mitigation and logic switching circuit 10', $D_{b2}$ is the second delay time by the second delay buffer 26 within the 'Error masking circuit 20'.

Because a SET (single Event Transient) occurs consecutively when ionized radiation affects the nodes in a circuit during a certain time duration, the SEU of a general sequential element may flip the value within the sequential element. Because of the cross-coupled connection unit of the general sequential element, the bit values within the circuit are fixed to the flipped value until a next data transfer is made.

But in a sequential element to which the applied with RTLS-based self-repairing system 1 according to an embodiment of the present invention is applied, wrong bit values are continuously repaired, a SEU is repaired immediately. But if the radiation source continuously affects a certain specific node in a circuit during a certain time period, the second delay provided by the second delay buffer 26 needs to be longer than the time duration of the radiation.

FIG. 7 shows a simulation result according to time analysis of the error-repair according to an embodiment of the present invention.

FIG. 7(a) shows a case where the RTLS-based self-repairing system 1 according to an embodiment of the present invention generates various errors to the nodes in the circuit while storing the value '0'.

When the RTLS-based self-repairing system 1 stores the value '0', the error injected in the internal node with the second internal circuit signal Q2 is immediately repaired and isn't exposed to the node with the output signal Q.

When the RTLS-based self-repairing system 1 stores the value '0' and when an error is injected into the internal node with the first internal circuit signal Q1 or the internal node with the feedback signal Q3, the error is repaired after certain time duration. But the errors of internal nodes are not transferred to the output node with the output signal Q.

FIG. 7(b) shows a case where the RTLS-based self-repairing system 1 according to an embodiment of the present invention generates various errors to the nodes in the circuit while storing the value '1'.

After a data transfer, while the RTLS-based self-repairing system 1 stores the value '1', the error injected into the internal node with the second internal circuit signal Q2 is immediately repaired and isn't exposed to the node with the output signal Q.

When the RTLS-based self-repairing system 1 stores the value '1' and when an error is injected into the internal node with the first internal circuit signal Q1 or the internal node with the feedback signal Q3, the error is repaired after certain time duration. But the errors of internal nodes are not transferred to the output node with the output signal Q.

The error directly injected into the node with the output signal a disapperars rapidly after the error injection if the error is not transferred from other nodes.

Also, the RTLS-based self-repairing system 1 stores 1-bit data as a sequential circuit and repairs an error occurred at the internal nodes of the system.

FIG. 8 is a table for comparing for other SEU hardening methods according to a prior technique with the RTLS-based self-repairing system 1 according to an embodiment of the present invention.

The first row of the table represents fields, the second row of the table represents the RTLS-based self-repairing system 1 according to an embodiment of the present invention, the third to seventh rows of the table represent techniques called TMR, ABC, RAZOR II, SEOFF, and BISER as prior arts, respectively.

The first column of the table represents the identifier of a comparison method, the second column represents the number of transistors required for data storage, the third column represents the number of transistors required for error-repair, the fourth column represents the transistor overhead, the fifth column represents power overhead, the sixth column represents whether both a repairing hardware and a data storage hardware can be self-repaired at the same time, and the seventh column represents a condition for error-repair.

Figure 9:
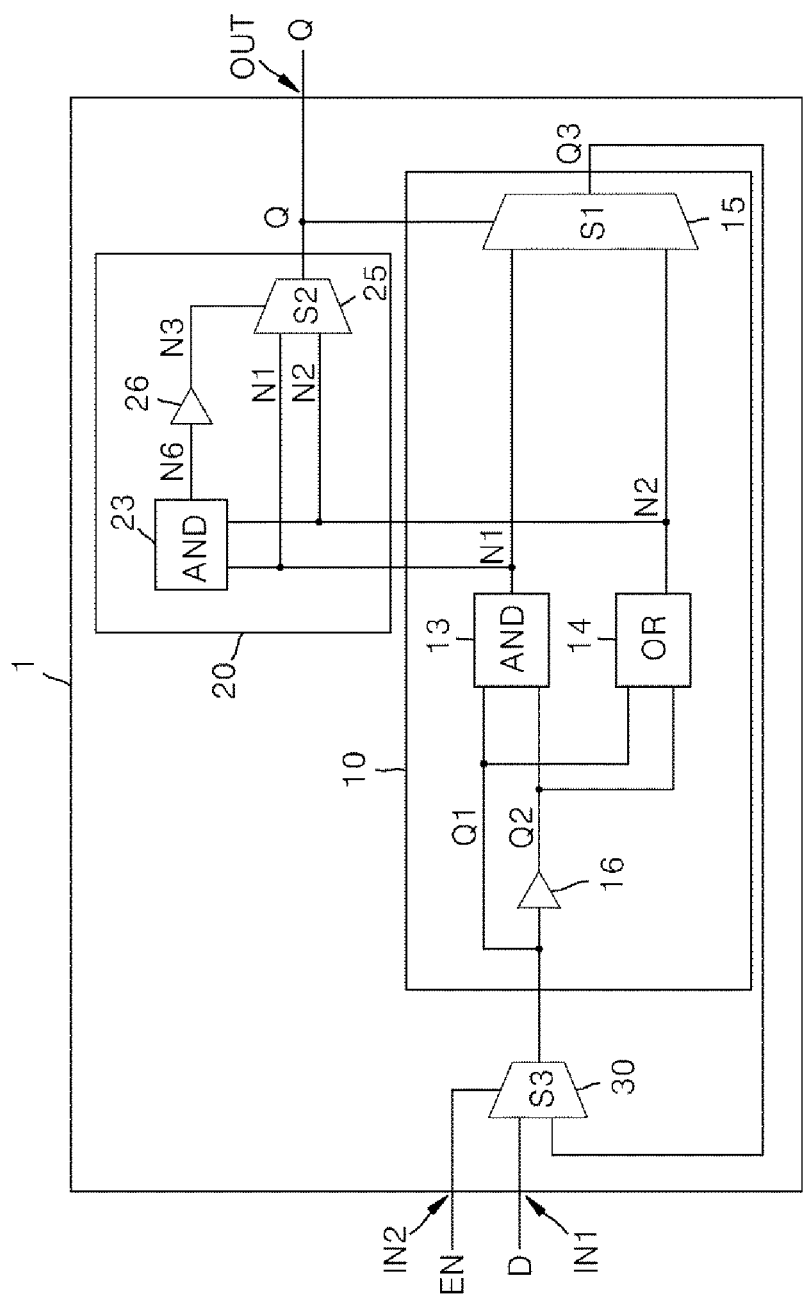
FIG. 9 shows the composition of an electric device 1 provided according to an embodiment of the present invention.

FIG. 9 shows the composition of an electric device 1 provided according to an embodiment of the present invention.

The electric device 1 may include a first switch-unit 15 providing a first internal circuit signal Q1, a first delay circuit unit 16 outputting a second internal circuit signal Q2 which is generated by delaying the first internal circuit signal Q1, a first AND logic 13 outputting a first repair-signal N1 generated by a logical AND operation between the first internal circuit signal Q1 and the second internal circuit signal Q2, a first OR logic 14 outputting a second repair-signal N2 generated by a logical OR operation between the first internal circuit signal Q1 and the second internal circuit signal Q2, and a second switch-unit 25 selecting one of the first repair-signal N1 and the second repair-signal N2 according to a third internal circuit signal N3 generated by a logical AND operation between the first repair-signal N1 and the second repair-signal N2 and providing the selected one as an output signal Q through an output terminal OUT. Here, by selecting one of the first repair-signal N1 and the second repair-signal N2 according to the output signal Q, the first switch-unit 15 may provide the first internal circuit signal Q1.

Here, the first switch-unit 15 may be configured to select the first repair-signal N1 when the output signal Q is '0', and to select the second repair-signal N2 when the output signal Q is '1'.

Here, the electric device 1 may further include a second AND logic 23 outputting an intermediate signal N6 generated by a logical AND operation between the first repair-signal N1 and the second repair-signal N2, and a second delay circuit unit 26 outputting the third internal circuit signal N3 generated by delaying the intermediate signal N6.

Here, a second delay time $D_{b2}$ of the second delay circuit unit 26 may be a half of a first delay time $D_{b1}$ of the first delay circuit unit 16.

Here, the electric device 1 may further include a first input terminal IN1 into which an external input value D is inputted, a third switch-unit 30 selecting one of the external input value D and a feedback signal Q3 outputted from the first switch-unit 15, and a second input terminal IN2 into which a route control signal (path control signal) EN controlling an operation of the third switch-unit 30 is inputted.

Figure 10A:
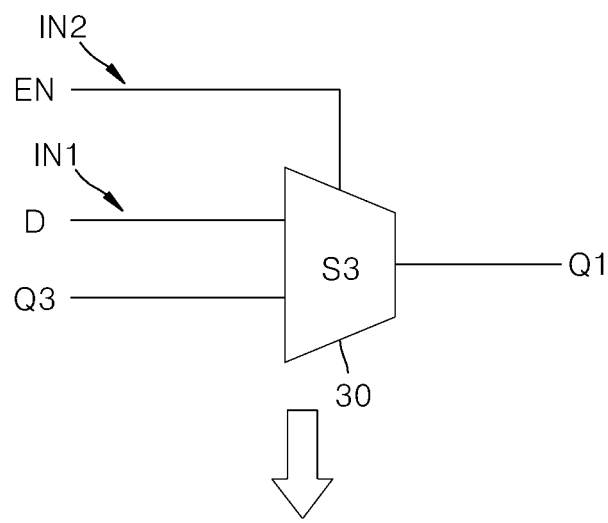
FIGS. 10(a) and 10(b) show an embodiment of the third switch-unit shown in FIG. 9.
Figure 10B:
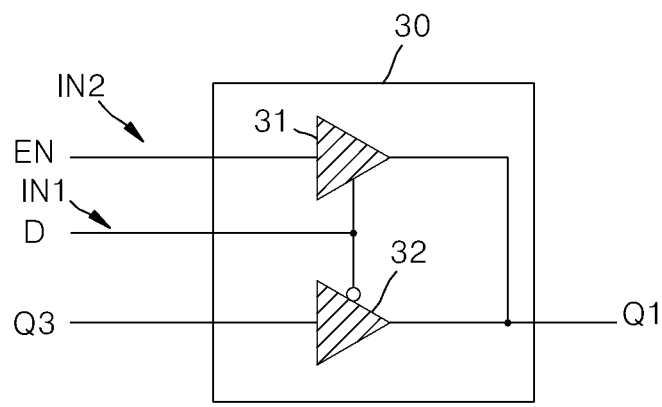

FIG. 10 shows an embodiment of the third switch-unit shown in FIG. 9.

The third switch-unit 30 may include a first tri-state buffer 31 into which the external input value D is inputed, and a second tri-state buffer 32 into which the feedback signal Q3 is inputted. Here, the first internal circuit signal Q1 is determined by the output of the first tri-state buffer 31 and the output of the second tri-state buffer 32. And the state of the first tri-state buffer 31 and the state of the second tri-state buffer 32 can be controlled by the route control signal EN, respectively.

Figure 11:
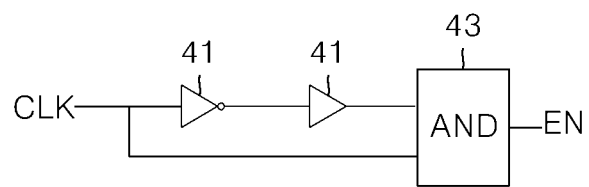
FIG. 11 shows an embodiment of the circuit 40 generating the route control signal EN shown in FIG. 9.

FIG. 11 shows an embodiment of the circuit 40 generating the route control signal EN shown in FIG. 9.

The route control signal EN may be generated by a logical AND operation between a clock signal CLK and a delayed clock signal which is generated by delaying the clock signal. Here, the delay may be generated by using a fifth buffer 41 and a sixth buffer 42.

Figure 12:
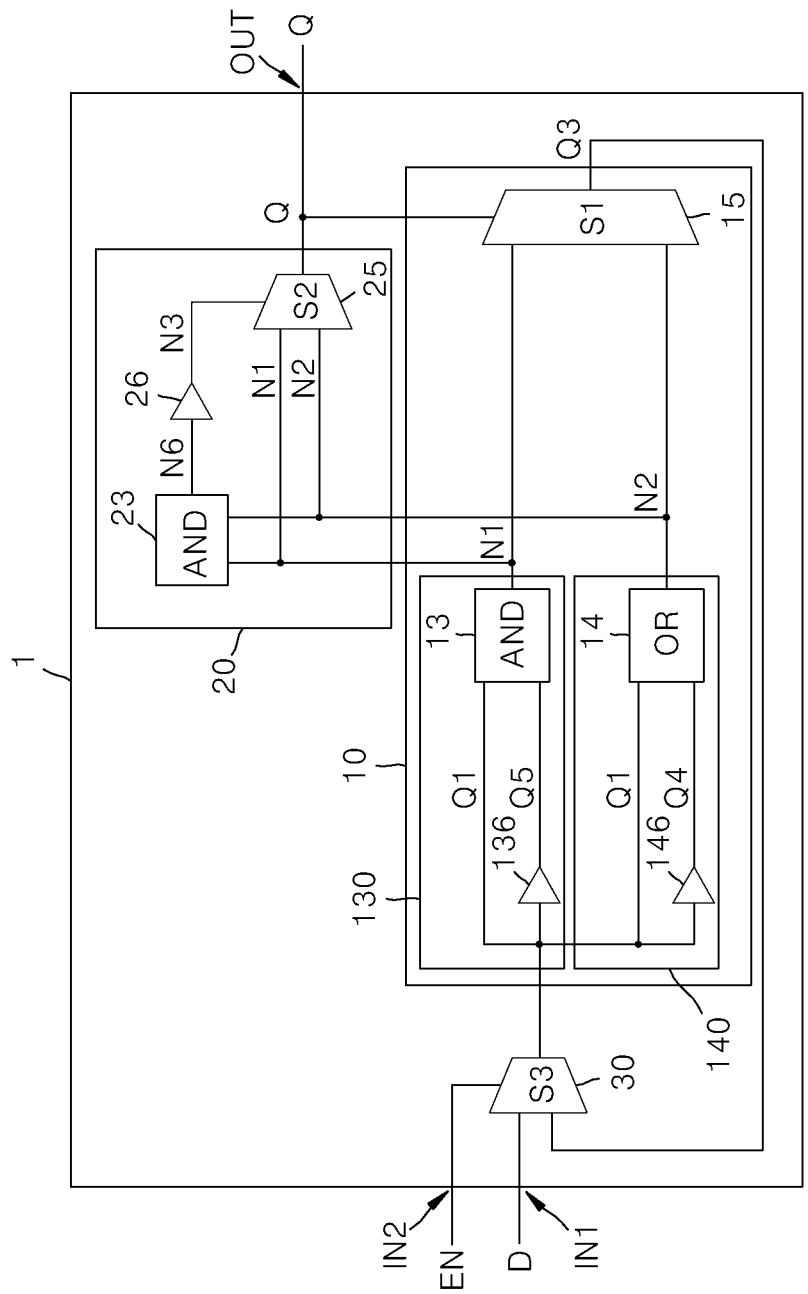
FIG. 12 shows the composition of an electric device 1 provided according to another embodiment of the present invention.

FIG. 12 shows an electric device 1 provided according to another embodiment of the present invention.

The electric device 1 may include a first switch-unit 15 providing a first internal circuit signal Q1, a first state transition storage logic 130 receiving the first internal circuit signal Q1 and outputting a first repair-signal N1, a second state transition storage logic 140 receiving the first internal circuit signal Q1 and outputting a second repair-signal N2, and a second switch-unit 25 selecting one of the first repair-signal N1 and the second repair-signal N2 according to a third internal circuit signal N3 generated by a logical AND operation between the first repair-signal N1 and the second repair-signal N2 and providing the selected one as an output signal Q through an output terminal OUT. Here, by selecting one of the first repair-signal N1 and the second repair-signal N2 according to the output signal Q, the first switch-unit 15 may provide the first internal circuit signal Q1.

Here, the first state transition storage logic 130 may include a third delay circuit unit 136 outputting a fifth internal circuit signal Q5 which is generated by delaying the first internal circuit signal Q1, and a first AND logic 13 outputting a first repair-signal N1 generated by a logical AND operation between the first internal circuit signal Q1 and the fifth internal circuit signal Q5.

And the second state transition storage logic 140 may include a fourth delay circuit unit 146 outputting a fourth internal circuit signal Q4 which is generated by delaying the first internal circuit signal Q1, and a first OR logic 14 outputting a second repair-signal N2 generated by a logical OR operation between the first internal circuit signal Q1 and the fourth internal circuit signal Q4.

Those skilled in the art could easily make various alterations or modifications to the above-mentioned embodiments of the present invention without departing the essential characteristics of the present invention. The claims that do not refer to each other may be combined with each other within the scope of understanding of the present disclosure.

1: electric device
13: first AND logic
14: first OR logic
15: first switch-unit
16: first delay circuit unit
23: second AND logic
25: second switch-unit
26: second delay circuit unit
31: first tri-state buffer
32: second tri-state buffer
30: third switch-unit
130: first state transition storage logic
136: third delay circuit unit
140: second state transition storage logic
146: fourth delay circuit unit
CLK: clock signal
D: external input value
EN: route control signal
IN1: first input terminal
IN2: second input terminal
N1: first repair-signal
N2: second repair-signal
N3: third internal circuit signal
OUT: output terminal
Q: output signal
Q1: first internal circuit signal
Q2: second internal circuit signal
Q3: feedback signal
Q5: fifth internal circuit signal

What is claimed is:

1. An electric device, comprising:
a first switch-unit providing a first internal circuit signal;
a first delay circuit unit outputting a second internal circuit signal which is generated by delaying the first internal circuit signal;
a first AND logic outputting a first repair-signal generated by a logical AND operation between the first internal circuit signal and the second internal circuit signal;
a first OR logic outputting a second repair-signal generated by a logical OR operation between the first internal circuit signal and the second internal circuit signal; and
a second switch-unit selecting one of the first repair-signal and the second repair-signal according to a third internal circuit signal generated by an operation including a logical AND operation between the first repair-signal and the second repair-signal and providing the selected one as an output signal through an output terminal;
wherein, the first switch-unit chooses one of the first repair-signal and the second repair-signal according to the output signal and provides the chosen one as first internal circuit signal.

2. The device of claim 1, wherein, the first switch-unit selects the first repair-signal when the output signal is '0', and the first switch-unit selects the second repair-signal when the output signal is '1'.

3. The device of claim 1, further comprising:
a second AND logic outputting a intermediate signal generated by the logical AND operation between the first repair-signal and the second repair-signal; and
a second delay circuit unit outputting the third internal circuit signal generated by delaying the intermediate signal.

4. The device of claim 3, wherein, a second delay time of the second delay circuit unit is a half of a first delay time of the first delay circuit unit.

5. The device of claim 1, further comprising:
a first input terminal into which an external input value is inputted;
a third switch-unit selecting one of the external input value and a feedback signal outputted from the first switch-unit; and
a second input terminal into which a route control signal controlling an operation of the third switch-unit is inputted.

6. The device of claim 5, wherein,
the third switch-unit comprises:
a first tri-state buffer into which the external input value is inputted; and
a second tri-state buffer into which the feedback signal is inputted,
wherein,
the first internal circuit signal is determined by the output of the first tri-state buffer and the output of the second tri-state buffer,
the state of the first tri-state buffer and the state of the second tri-state buffer are controlled by the route control signal, respectively.

7. The device of claim 5, wherein, the route control signal is generated by a logical AND operation between a clock signal and a delayed clock signal delaying the clock signal.

8. An electric device, comprising:
a first switch-unit providing a first internal circuit signal;
a first state transition storage logic receiving the first internal circuit signal and outputting a first repair-signal;
a second state transition storage logic receiving the first internal circuit signal and outputting a second repair-signal; and
a second switch-unit selecting one of the first repair-signal and the second repair-signal according to a third internal circuit signal generated by an operation including a logical AND operation between the first repair-signal and the second repair-signal and providing the selected one as an output signal through an output terminal;
wherein, the first switch-unit chooses one of the first repair-signal and the second repair-signal according to the output signal and provides the chosen one as first internal circuit signal.

9. The device of claim 8, wherein, p1 the first state transition storage logic includes a third delay circuit unit outputting a fifth internal circuit signal which is generated by delaying the first internal circuit signal; and a first AND logic outputting a first repair-signal generated by a logical AND operation between the first internal circuit signal and the fifth internal circuit signal;
the second state transition storage logic includes a fourth delay circuit unit outputting a fourth internal circuit signal which is generated by delaying the first internal circuit signal; and a first OR logic outputting a second repair-signal generated by a logical OR operation between the first internal circuit signal and the fourth internal circuit signal.

10. An electric device comprising an electric circuit, the electric circuit comprising:
- a first switch-unit providing a first internal circuit signal (Q1);
- a first delay circuit unit outputting a second internal circuit signal(Q2) which is generated by delaying the first internal circuit signal;
- a first AND logic outputting a first repair-signal(N1) generated by a logical AND operation between the first internal circuit signal and the second internal circuit signal;
- a first OR logic outputting a second repair-signal(N2) generated by a logical OR operation between the first internal circuit signal and the second internal circuit signal; and
- a second switch-unit selecting one of the first repair-signal and the second repair-signal according to a third internal circuit signal(N3) generated by an operation including a logical AND operation between the first repair-signal and the second repair-signal and providing the selected one as an output signal(Q) through an output terminal;
- wherein, the first switch-unit chooses one of the first repair-signal and the second repair-signal according to the output signal and provides the chosen one as first internal circuit signal.

11. Data storage device, comprising:
- a first switch-unit providing a first internal circuit signal (Q1);
- a first delay circuit unit outputting a second internal circuit signal(Q2) which is generated by delaying the first internal circuit signal;
- a first AND logic outputting a first repair-signal(N1) generated by a logical AND operation between the first internal circuit signal and the second internal circuit signal;
- a first OR logic outputting a second repair-signal(N2) generated by a logical OR operation between the first internal circuit signal and the second internal circuit signal; and
- a second switch-unit selecting one of the first repair-signal and the second repair-signal according to a third internal circuit signal(N3) generated by an operation including a logical AND operation between the first repair-signal and the second repair-signal and providing the selected one as an output signal(Q) through an output terminal;
- wherein, the first switch-unit chooses one of the first repair-signal and the second repair-signal according to the output signal and provides the chosen one as first internal circuit signal, and
- the data stored in the data storage device is the output signal.

* * * * *